(12) United States Patent
Tsukiyama et al.

(10) Patent No.: US 9,972,600 B2
(45) Date of Patent: May 15, 2018

(54) SEMICONDUCTOR DEVICE INCLUDING PROTECTIVE FILM OVER A SUBSTRATE

(71) Applicant: Toshiba Memory Corporation, Tokyo (JP)

(72) Inventors: Satoshi Tsukiyama, Kanagawa (JP); Hideko Mukaida, Tokyo (JP); Yoichiro Kurita, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 14/636,071

(22) Filed: Mar. 2, 2015

(65) Prior Publication Data

US 2016/0079184 A1    Mar. 17, 2016

(30) Foreign Application Priority Data

Sep. 17, 2014  (JP) ................................. 2014-188531

(51) Int. Cl.
*H01L 23/48*  (2006.01)
*H01L 25/065*  (2006.01)
(Continued)

(52) U.S. Cl.
CPC ...... *H01L 25/0657* (2013.01); *H01L 23/3128* (2013.01); *H01L 23/3135* (2013.01);
(Continued)

(58) Field of Classification Search
CPC . H01L 2224/32145; H01L 2224/73204; H01L 2924/15311; H01L 25/0657;
(Continued)

(56) References Cited

U.S. PATENT DOCUMENTS 6,664,644 B2    12/2003  Morozumi
6,765,299 B2     7/2004  Takahashi et al.
(Continued)

FOREIGN PATENT DOCUMENTS

JP    2001257310 A    9/2001
JP    2003051580 A    2/2003
(Continued)

OTHER PUBLICATIONS

Taiwan Office Action dated Aug. 9, 2016, filed in Taiwan counterpart Application No. 104106903, 13 pages (with translation).
(Continued)

*Primary Examiner* — Khiem D Nguyen
(74) *Attorney, Agent, or Firm* — Patterson & Sheridan, LLP

(57) ABSTRACT

A semiconductor device includes a first semiconductor chip including an inorganic protective film, a second semiconductor chip including an organic protective film and a re-wiring layer, the second semiconductor chip being electrically connected to the first semiconductor chip through a through-silicon via and a bump connection, a third semiconductor chip including an inorganic protective film, the third semiconductor chip being electrically connected to the second semiconductor chip through the re-wiring layer and a bump connection, a first resin layer filled between the first semiconductor chip and the second semiconductor chip, the first resin layer being in contact with the inorganic protective film, and a second resin layer filled between the second semiconductor chip and the third semiconductor chip, the second resin layer being in contact with the organic protective film and the inorganic protective film.

17 Claims, 4 Drawing Sheets

(51) Int. Cl.
  *H01L 23/00* (2006.01)
  *H01L 23/498* (2006.01)
  *H01L 23/538* (2006.01)
  *H05K 1/00* (2006.01)
  *H01L 23/31* (2006.01)

(52) U.S. Cl.
  CPC .... *H01L 23/49827* (2013.01); *H01L 23/5384* (2013.01); *H01L 24/13* (2013.01); *H01L 24/16* (2013.01); *H05K 1/00* (2013.01); *H01L 23/481* (2013.01); *H01L 2224/16225* (2013.01); *H01L 2924/181* (2013.01)

(58) Field of Classification Search
  CPC . H01L 2224/73253; H01L 2225/06506; H01L 2225/06517; H01L 2225/06541; H01L 2225/1058; H01L 2225/0652; H01L 2224/49174; H01L 23/3135; H01L 23/49827; H01L 23/5384; H01L 23/481; H01L 2224/16145; H01L 2224/13025; H01L 2225/06513
  See application file for complete search history.

(56) References Cited

U.S. PATENT DOCUMENTS

| | | | |
|---|---|---|---|
| 7,528,476 B2 | 5/2009 | Ito | |
| 2007/0200216 A1* | 8/2007 | Kim | H01L 21/563 257/686 |
| 2007/0281374 A1* | 12/2007 | Lee | H01L 21/76898 438/14 |
| 2008/0088031 A1* | 4/2008 | Kwon | H01L 25/0657 257/777 |
| 2008/0191357 A1* | 8/2008 | Kouno | H01L 24/03 257/762 |
| 2011/0057327 A1* | 3/2011 | Yoshida | H01L 21/6835 257/777 |
| 2012/0049354 A1* | 3/2012 | Sawayama | H01L 21/561 257/737 |
| 2012/0248600 A1* | 10/2012 | Shigezane | H01L 23/481 257/737 |
| 2013/0075895 A1* | 3/2013 | Miura | H01L 27/115 257/737 |
| 2013/0134583 A1 | 5/2013 | Tsukiyama et al. | |

FOREIGN PATENT DOCUMENTS

| | | |
|---|---|---|
| JP | 20030282819 A | 10/2003 |
| JP | 2006179562 A | 7/2006 |
| JP | 2007180529 A | 7/2007 |
| JP | 2012069903 A | 4/2012 |
| JP | 2013080912 A | 5/2013 |

OTHER PUBLICATIONS

Japanese Office Action dated Jun. 6, 2017, filed in Japanese counterpart Application No. 2014-183531, 10 pages (with translation).

* cited by examiner

SEMICONDUCTOR DEVICE INCLUDING PROTECTIVE FILM OVER A SUBSTRATE

CROSS-REFERENCE TO RELATED APPLICATION

This application is based upon and claims the benefit of priority from Japanese Patent Application No. 2014-188531, filed Sep. 17, 2014, the entire contents of which are incorporated herein by reference.

FIELD

An embodiment described herein relates generally to a semiconductor device.

BACKGROUND

A semiconductor memory device comprises thin memory chips such as NAND flash memories stacked in layers and disposed on a circuit board to achieve compact size and high capacity. Through-silicon vias disposed in the memory chips provide electrical connections between the stacked memory chips. Micro-bumps electrically connect the through-silicon vias to each other. A semiconductor chip such as an interface (IF) chip is disposed on the stacked memory chips. This semiconductor chip comprises an IF circuit that performs data communication between the memory chips and external devices. Since the electrode array of the IF chip is different from that of the memory chips, a re-wiring layer for relocating electrodes may be formed on the memory chip nearest the IF chip. The electrodes of the IF chip are electrically connected to the electrodes of the memory chip through the micro-bumps formed on the re-wiring layer.

Where micro-bumps provide the electrical connections between the chips, bump electrodes are positioned on adjacent semiconductor chips and the adjacent semiconductor chips are compression-bonded while applying heat to make the connection between the bump electrodes. An under-fill resin is disposed between the semiconductor chips to improve connection reliability and the like. Since adjacent semiconductor chips are connected only by the micro-bumps before the under-fill resin is introduced, warpage of the semiconductor chips after bump connection is likely to cause a connection failure (open failure). To address such a problem, an adhesive is provided locally between the semiconductor chips to improve the adhesive strength between the semiconductor chips. However, as the number of stacked semiconductor chips increases, the amount of warpage of the semiconductor chip increases.

DETAILED DESCRIPTION

An exemplary embodiment provides a semiconductor device comprising one or more organic protective film layers over a semiconductor substrate and one or more inorganic protective film layers over a semiconductor substrate, wherein the combination of layers serves to suppress connection failures between bump electrodes by limiting warpage of stacked semiconductor chips connected by the bump electrodes.

In general, according to one embodiment, a semiconductor device includes first, second, and third semiconductor chips, a first bump electrode, a first organic protective film, a re-wiring layer, and first and second resin layers. The first semiconductor chip includes a first semiconductor substrate having a first surface and a second surface, a first electrode provided below the first surface of the first substrate, and a first inorganic protective film covering at least a part of the first surface of the first substrate while exposing at least a part of the first electrode. The first bump electrode is provided on the first electrode. The second semiconductor chip includes a second semiconductor substrate having a first surface and a second surface, a via provided to pass through the second semiconductor substrate, the via being electrically connected to the first bump electrode, a second electrode provided below the first surface of the second substrate and electrically connected to the via, and a second inorganic protective film covering at least a part of the first surface of the second substrate while exposing at least a part of the second electrode. The first organic protective film covers at least a part of the second inorganic protective film while exposing at least apart of the second electrode. The re-wiring layer is disposed on the first organic protective film, the re-wiring layer being electrically connected to the second electrode. The second bump electrode is electrically connected to the re-wiring layer. The third semiconductor chip includes a third semiconductor substrate and electrically connected to the second bump electrode, a third inorganic protective film covering the first surface of the third substrate while exposing at least a part of the third electrode. The first resin layer is provided between the first semiconductor chip and the second semiconductor chip, the first resin layer being in contact with the first inorganic protective film. The second resin layer is provided between the second semiconductor chip and the third semiconductor chip, the second resin layer being in contact with the third inorganic protective film.

Figure 1:
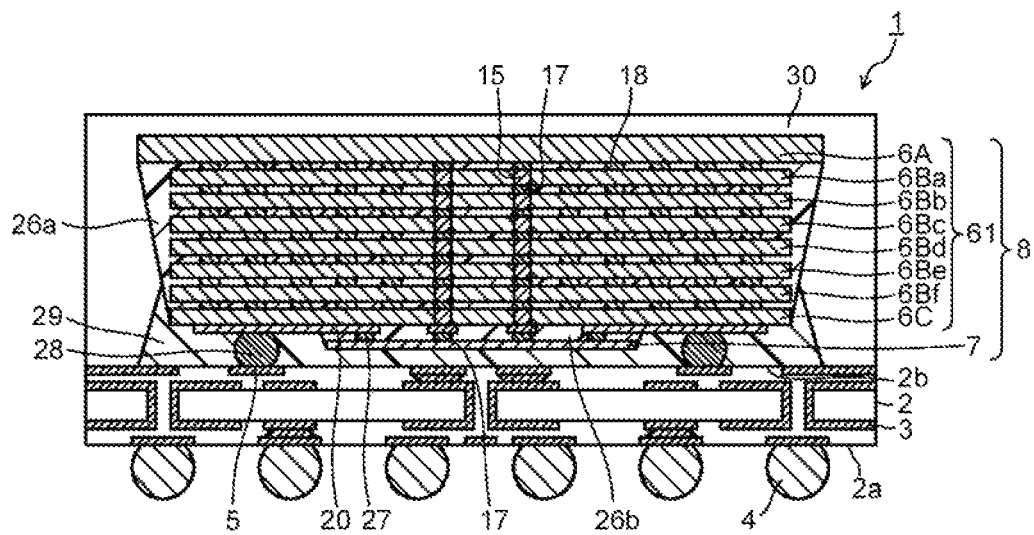
FIG. 1 is a cross-sectional view showing a semiconductor device according to an embodiment.
Figure 2:
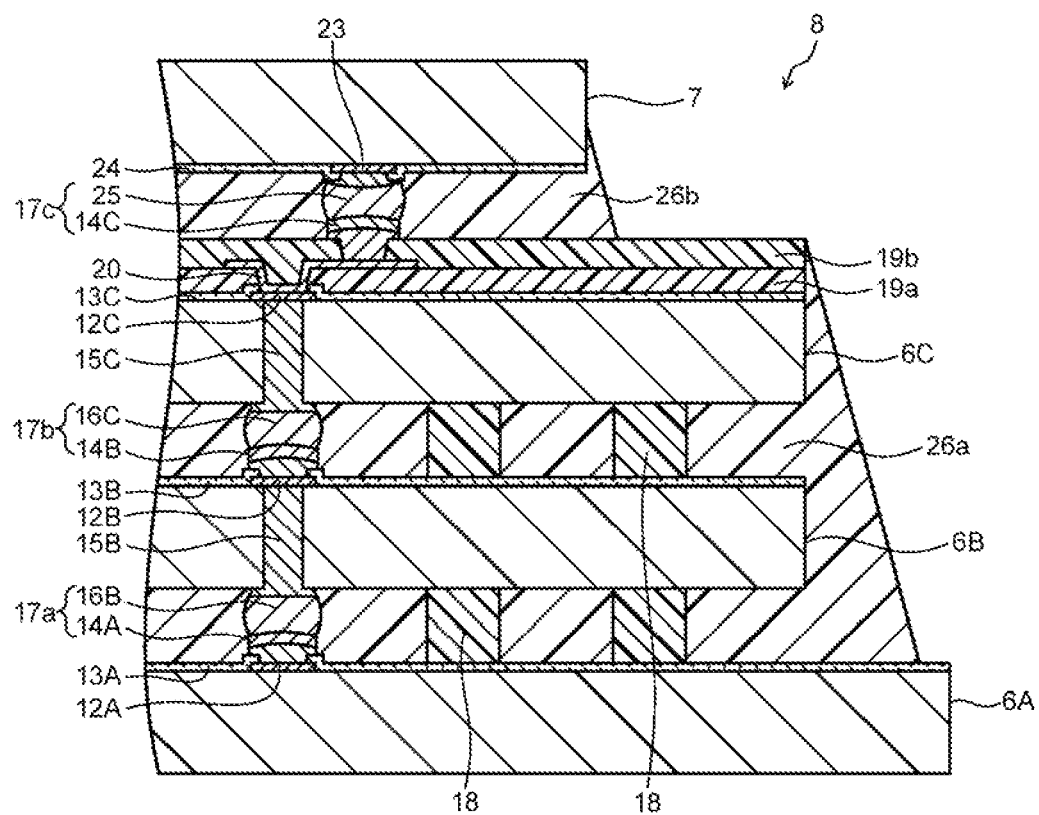
FIG. 2 is an enlarged cross-sectional view showing a part of the semiconductor device shown in FIG. 1.
Figure 3:
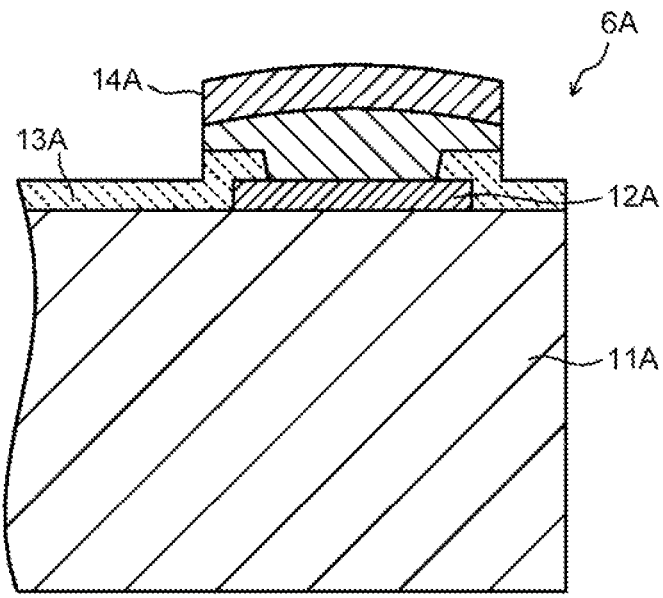
FIG. 3 is an enlarged cross-sectional view showing a part of a semiconductor chip included in the semiconductor device shown in FIG. 1.
Figure 4:
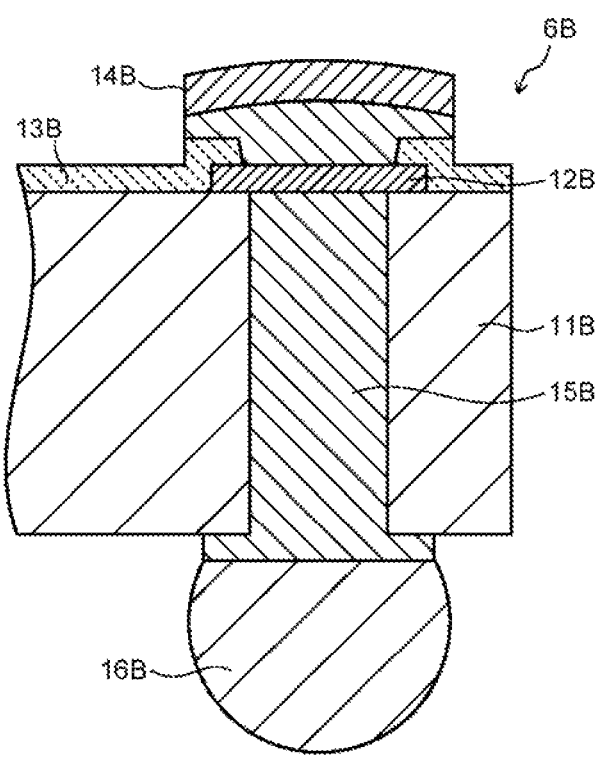
FIG. 4 is an enlarged cross-sectional view showing a part of a semiconductor chip included in the semiconductor device shown in FIG. 1.
Figure 5:
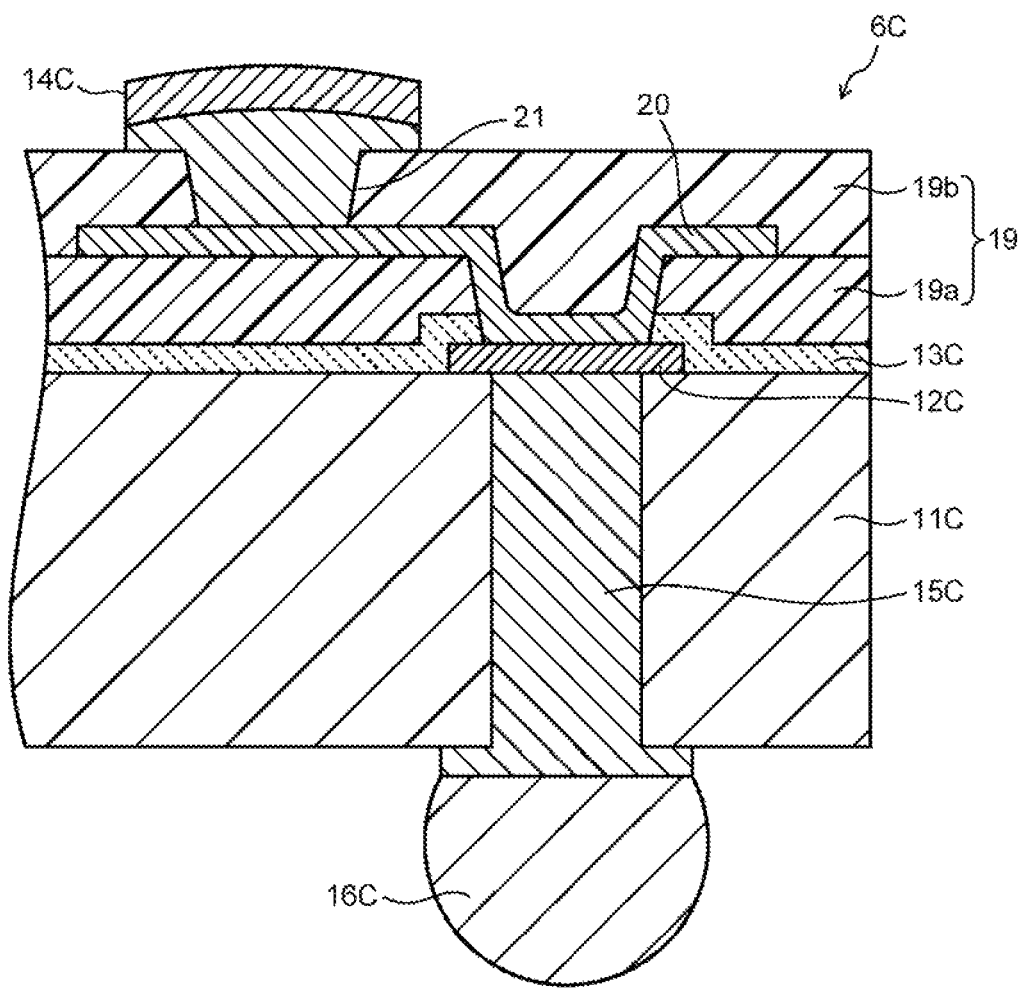
FIG. 5 is an enlarged cross-sectional view showing a part of a semiconductor chip included in the semiconductor device shown in FIG. 1.
Figure 6:
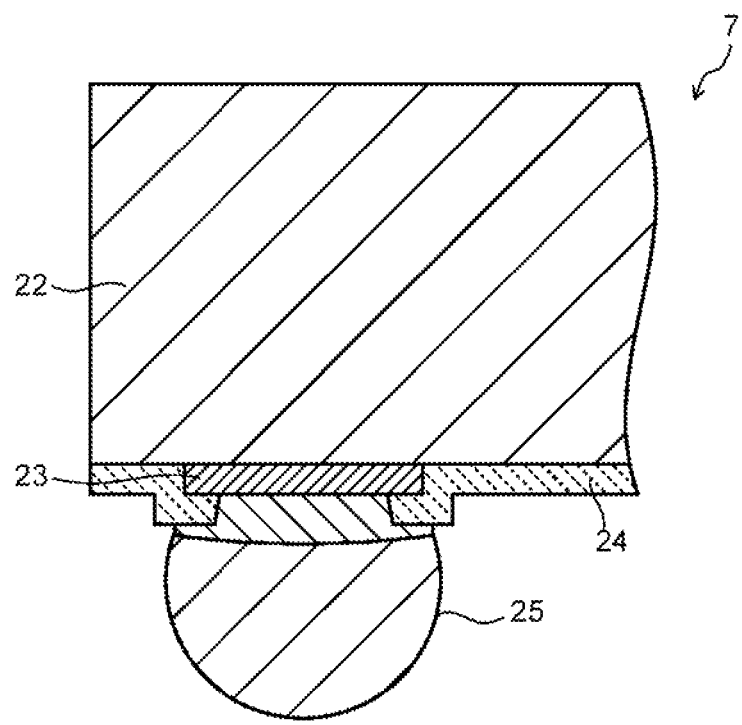
FIG. 6 is an enlarged cross-sectional view showing a part of a semiconductor chip included in the semiconductor device shown in FIG. 1.

The semiconductor device according to an embodiment will be described with reference to the drawings. FIG. 1 is a cross-sectional view showing the semiconductor device according to the embodiment and FIG. 2 is an enlarged cross-sectional view showing a part of the semiconductor device shown in FIG. 1. Each of FIGS. 3 to 6 is an enlarged cross-sectional view showing a part of the structure of a semiconductor chip included in the semiconductor device shown in FIG. 1. A semiconductor device 1 shown in FIG. 1 is a semiconductor memory device including memory chips and an interface (IF) chip as semiconductor chips. The semiconductor device 1 includes a circuit board 2. The circuit board 2 comprises an insulating resin board on which or in which a wiring network 3 is provided. Specifically, the circuit board 2 is a printed wiring board (such as a multilayer printed circuit board) that uses an insulating resin such as a glass-epoxy resin or BT resin (bismaleimide triazine resin).

The circuit board 2 includes a first surface 2a on which external connection terminals are formed and a second surface 2b on which semiconductor chips are mounted. External connection terminals 4 are formed on the first surface 2a of the circuit board 2. If the semiconductor device 1 is used as a BGA package, the external connection terminals 4 are configured as projecting terminals including solder balls, solder plating, Au plating, or the like. If the semiconductor device 1 is used as an LGA package, metal lands are provided as the external connection terminals 4. Internal connection terminals 5 are disposed on the second surface 2b of the circuit board 2. The internal connection terminals 5 function as connection portions (connection pads) during connection with a semiconductor chip. The internal connection terminals 5 are electrically connected to the external connection terminals 4 through the wiring network 3.

On the second surface 2b of the circuit board 2, a chip stack 8 including a plurality of memory chips 6 (6A, 6Ba to 6Bf, and 6C) and an IF chip 7 are disposed. The memory chips 6 are, for example, semiconductor chips including nonvolatile storage elements such as NAND flash memories. The IF chip 7 is a semiconductor chip including an IF circuit for performing data communication between the plurality of memory chips 6 and external devices. FIG. 1 shows the chip stack 8 including eight memory chips 6A, 6Ba to 6Bf, and 6C, but the number of memory chips 6 is not limited to eight. The number of memory chips 6 is set as appropriate depending on the storage capacity of one memory chip 6, the storage capacity and use of the semiconductor device 1, and the like.

The chip stack 8 may be formed before being mounted on the second surface 2b of the circuit board 2. In forming the chip stack 8, the plurality of memory chips 6A, 6Ba to 6Bf, and 6C are stacked in this order to form a stacked body 61. The IF chip 7 is stacked on the stacked body 61. The chip stack 8 formed as described above is mounted on the second surface 2b of the circuit board 2 such that IF chip 7 of chip stack 8 is closest to the circuit board 2.

The chip stack 8 includes at least the memory chip 6A and memory chip 6C. The stacking order of the stacked body 61 is such that memory chip 6A is disposed farthest from the IF chip 7 and memory chip 6C is disposed closest to the IF chip 7. The semiconductor chip IF chip 7 is electrically connected to these memory chips through a re-wiring layer described below. One or more of the intermediate semiconductor chips (memory chips 6Ba to 6Bf) may also be included. If included, the intermediate semiconductor chips (memory chips 6Ba to 6Bf) are disposed between memory chip 6A and memory chip 6C.

The structure of the chip stack 8 will be described in detail with reference to FIGS. 2 to 6. The chip stack 8 is formed by stacking the plurality of memory chips 6A, 6B, and 6C sequentially and then stacking the IF chip 7 on the stacked body 61. The memory chip 6A is disposed farthest from the IF chip 7 and the memory chip 6C is disposed nearest the IF chip 7 in the stacking order of the stacked body 61. Memory chips 6A and 6C have structures that depend on their stacking positions. The intermediate memory chips 6Ba to 6Bf in the stacked body 61 shown in FIG. 1 have the same structure. In FIG. 2, a memory chip 6B shows the typical structure of the intermediate memory chips 6Ba to 6Bf. As described above, the presence of the intermediate memory chip 6B is arbitrary. The stacked body 61 may not include the intermediate memory chip 6B or may include one or more memory chips 6B (6Ba to 6Bf).

The memory chip 6A in the stacked body 61 includes a semiconductor substrate 11A on which circuits of memory elements and the like are formed, an electrode 12A disposed on a first surface of the semiconductor substrate 11A, an inorganic protective film 13A, which covers a part of the first surface of the semiconductor substrate 11A while exposing the electrode 12A, and a bump electrode 14A disposed on the electrode 12A. As described in detail below, the first surface (circuit surface) of the memory chip 6A is covered with the inorganic protective film 13A and not covered with an organic protective film including polyimide resin or the like. The outermost layer on the first surface side of the memory chip 6A is the inorganic protective film 13A, which is in contact with an under-fill resin to be described below.

The intermediate memory chip 6B in the stacked body 61 includes a semiconductor substrate 11B, an electrode 12B disposed on a first surface of the semiconductor substrate 11B, an inorganic protective film 13B, which covers a part of the upper surface of the semiconductor substrate 11B while exposing the electrode 12B, and a bump electrode 14B disposed on the electrode 12B. In addition, the memory chip 6B includes a through-silicon via (TSV) 15B. The through-silicon via 15B connects electrically to the electrode 12B on the first surface of the semiconductor substrate 11B, passes through the semiconductor substrate 11B and connects electrically to a bump electrode 16B on the second surface (non-circuit surface) of the semiconductor substrate 11B. A part of the first surface (circuit surface) of the memory chip 6B is covered with the inorganic protective film 13B, which is in contact with the under-fill resin to be described below.

The intermediate memory chip 6B is stacked on the memory chip 6A. The bump electrode 16B of memory chip 6B contacts the bump electrode 14A of the memory chip 6A. The electrode 12B of the memory chip 6B is electrically connected to the electrode 12A of the memory chip 6A through the through-silicon via 15B and a connected portion 17a, comprising the bump electrode 16B and the bump electrode 14A. If the stacked body 61 includes the one or more memory chips 6B (6Ba to 6Bf), the one or more memory chips 6B are sequentially stacked with the bump electrode 16B of the memory chip 6B on the first (circuit) surface connected to the bump electrode 14B of the memory chip 6 on the second (non-circuit) surface. The electrodes 12B of the one or more memory chips 6B are electrically connected to each other through the through-silicon vias 15B and the connected portions 17a, comprising the bump electrodes 14A and the bump electrodes 16B.

One or more adhesive spacers 18 are disposed between the memory chip 6A and each of the one or more intermediate memory chips 6B. The one or more adhesive spacers 18 have a projecting shape and are disposed locally between the memory chips 6A and 6B. The adhesive spacers 18 not only function as stoppers that keep the gap between the memory chips 6A and 6B, but also function as connecting members that bond the memory chips 6A and 6B to each other in a preliminary step before an under-fill resin is filled. The adhesive spacers 18 functioning as stopper members may be disposed separately from the adhesive spacers 18 functioning as connecting members between the memory chips 6A and 6B. If the one or more memory chips 6B are stacked, the adhesive spacers 18 are placed between the one or more memory chips 6B.

The memory chip 6C in the stacked body 61 includes an electrode 12C disposed on the first surface (circuit surface) of a semiconductor substrate 11C and an inorganic protective film 13C, which covers a part of the first surface of the semiconductor substrate 11C while exposing the electrode 12C. A first organic protective film 19a is disposed on at least a portion of the inorganic protective film 13C so as to expose the electrode 12C. A re-wiring layer 20 electrically connected to the electrode 12C is formed on the first organic protective film 19a. A second organic protective film 19b is formed on the re-wiring layer 20 and on at least a portion of the first organic protective film 19a. The second organic protective film 19b includes an opening 21 (see FIG. 5) for exposing a part of the re-wiring layer 20. A bump electrode 14C electrically connected to the re-wiring layer 20 through the opening 21 on the second organic protective film 19b. The re-wiring layer 20 electrically connects the electrode 12C to the bump electrode 14C to accommodate both the position of the electrode 12C and the shape of the electrode of the IF chip 7, to be discussed further below.

The memory chip 6C further includes a through-silicon via 15C, which is disposed to pass through the semiconductor substrate 11C. The through-silicon via 15C electrically connects to the electrode 12C, which is disposed on the first surface (circuit surface) of the semiconductor substrate 11C, and a bump electrode 16C, which is disposed on the second surface (non-circuit surface) of the semiconductor substrate 11C. The first surface (circuit surface) of the memory chip 6C is covered with the inorganic protective film 13C and the organic protective films 19a, 19b. The outermost layer on the first surface side of the memory chip 6C is the organic protective film 19b, which is in contact with the under-fill resin described below. The memory chip 6C is stacked on the memory chip 6B with the bump electrode 16C in contact with the bump electrode 14B of the memory chip 6B. The electrode 12C of the memory chip 6C is electrically connected to the electrode 12B of the memory chip 6B through the through-silicon via 15C and a connected portion 17b, comprising the bump electrode 16C and the bump electrode 14B. The one or more adhesive spacers 18 are locally disposed between the intermediate memory chip 6B and the memory chip 6C as in the case where they are disposed between the memory chips 6A and 6B.

As described above, in the stacked body 61, the plurality of memory chips 6A, 6B, and 6C are electrically connected to each other through the through-silicon vias 15 (including 15B and 15C) and bump connections 17 (including 17a, 17b, and 17c) disposed in the memory chips 6B and 6C, except that memory chip 6A lacks through-silicon vias 15. In addition, the adhesive spacers 18 placed between adjacent memory chips 6A, 6B, and 6C (and between intermediate memory chips 6B if there are one or more intermediate memory chips 6B) keep the memory chips 6A, 6B, and 6C and the memory chips 6A, 6B, and 6C bonded to each other in a preliminary step before an under-fill resin is filled.

The interface (IF) chip 7 is placed adjacent to the memory chip 6C of the stacked body 61. The semiconductor chip disposed on the stacked body 61 is not limited to the IF chip 7 including only an IF circuit. The IF chip 7 may include a controller circuit in addition to the IF circuit. A chip in which the IF circuit is mixed with the controller circuit (that is, a controller and IF chip) may be disposed on the stacked body 61. The type of IF chip 7 may be selected as appropriate based on the use of the semiconductor device 1 or the configuration of external devices. The IF chip 7 is subjected to flip-chip (FC) connection with not only the memory chip 6C through a face down scheme, but also the stacked body 61.

The IF chip 7 includes an electrode 23 disposed on the first surface (circuit surface) of a semiconductor substrate 22, an inorganic protective film 24, which is disposed on a part of the first surface (circuit surface) of the semiconductor substrate 22 while exposing the electrode 23, and a bump electrode 25 disposed on the electrode 23. The material disposed on the first surface (circuit surface) of the IF chip 7 is an inorganic protective film 24 and not an organic protective film. The outermost surface on the first surface (circuit surface) side of the IF chip 7 is the inorganic protective film 24, which is in contact with the under-fill resin described below. The IF chip 7 is stacked on the memory chip 6C with the bump electrode 25 connected to the bump electrode 14C of the memory chip 6C. The electrode 23 of the IF chip 7 is electrically connected to the electrode 12C of the memory chip 6C (and, in turn, to the electrodes 12A and 12B of the memory chips 6A and 6B) through a bump connection 17c, comprising the bump electrode 25 and the bump electrode 14C.

Various inorganic insulating materials may be used for the inorganic protective films 13 and 24. For example, a single-layer film or a stacked film including silicon nitride film (SiN film), silicon oxynitride film (SiON film), silicon oxide film (SiO film), carbon-doped silicon oxide film (SiOC film), or the like may be used. Various organic insulating materials may be used for the organic protective films 19a and 19b. For example, polyimide resin film, phenol resin film, acrylic resin film, polybenzoxazole resin film, polybenzocyclobutene resin film, or the like may be used. The first organic protective film 19a and the second organic protective film 19b may be the same organic resin film or different organic resin films.

The bump electrodes 14, 16, and 25 may comprise soldering materials including Sn alloy obtained by adding Cu, Ag, Bi, In, and the like to Sn or metal materials such as Cu, Ni, Au, Ag, Pd, Sn. Specific examples of soldering materials (Pb-free soldering) are Sn—Cu alloy, Sn—Ag alloy, Sn—Ag—Cu alloy, and the like. Metal materials are not limited to single-layer films and may be stacked films including a plurality of metal films of Cu/Ni, Cu/Ni/Cu, Cu/Ni/Au, Ni/Au, Cu/Au, and the like. In addition, metal materials may be an alloy including metals as shown above. Bump electrodes 14, 16 and 25 may comprise different materials and may comprise different types of materials. For example, the combination of the bump electrode 14 and the bump electrode 16 (or the bump electrode 25) may be soldering material/soldering material, metal material/soldering material, soldering material/metal material, and metal material/metal material, and the like. The shapes of the bump electrode 14 and the bump electrodes 16 and 25 may be a combination of projecting shapes (such as a hemispherical shape and a cylindrical shape) or a combination of a projecting shape and a flat shape (such as a pad).

At least one of the bump electrodes 14, 16 and 25 is preferably made of soldering materials. In terms of the ease of handling the memory chip 6 and the IF chip 7 when manufacturing the chip stack 8, it is preferable to form the bump electrode 14 made of metal materials such as Cu/Ni/Cu, Cu/Ni/Au, or Ni/Au on the first surface (circuit surface) of the memory chip 6 and to form the bump electrodes 16 and 25 made of soldering materials such as Sn—Cu alloy or Sn—Ag—Cu alloy on the second surface (non-circuit surface) of the memory chip 6 or the first surface (circuit surface) of the IF chip 7. In this case, the bump electrode 14 made of metal materials preferably has a flat shape and the bump electrodes 16 and 25 made of soldering materials preferably have projecting shapes. The bump connection 17 is formed by bringing the bump electrode 14 into contact with the bump electrodes 16 and 25, melting at least one of the bump electrodes (for example, the bump electrodes 16 and 25 made of soldering materials), and then integrating them.

The through-silicon via 15 may comprise a metal material of Cu, Ni, Au, Ag, or alloy including at least one of these metals. The re-wiring layer 20 is made of a single film or a stacked film of metal materials of, for example, Cu, Ni, Ti, Au, Ag, Al, and alloy including at least one of these metals. The electrodes 12 and 23 are metal pads made of generally Al or Al alloy.

The adhesive spacers 18 are made of a resin with, for example, photosensitive and heat-hardening properties. A specific example of a photosensitive and heat-hardening resin is a heat-hardening resin including a photosensitive agent such as a photosensitive adhesive resin. Since the photosensitive and heat-hardening resin is hardened by irradiation with ultraviolet light during forming of the adhesive spacers 18, the adhesive spacers 18 may function as stopper members for keeping the gap between the memory chips 6. In addition, since the adhesive spacers 18 are bonded to the memory chip 6 if the resin is heated and heat-hardened, it is possible to improve the adhesive strength between the memory chips 6 in the stacked body 61 before an under-fill resin is introduced. This prevents short circuits due to overloading of the bump connection 17 or an open failure of the bump connection 17 from occurring due to warpage of the memory chip 6. However, the adhesive spacers 18 alone may not sufficiently suppress the warpage of the memory chip 6 caused when the number of memory chips 6 in the stacked body 61 increases, as described later. Accordingly, protective films are provided on the first surfaces (circuit surfaces) of the memory chips 6 or the IF chip 7, as described in detail later.

The gaps between the memory chips 6A, 6B, and 6C included in the stacked body 61 are filled with a first under-fill resin 26a. In addition, the gap between the memory chip 6C and the IF chip 7 is filled with a second under-fill resin 26b. The second under-fill resin 26b may be formed concurrently with the forming process of the first under-fill resin 26a or may be formed in a separate process from the forming process of the first under-fill resin 26a. As an under-fill resin 26, heat-hardening resins such as an epoxy resin, phenol resin, acrylic resin, silicone resin, and polyimide resin are used. The stacked body 61 and the stacked chips 8 are configured as described above.

The stacked body 61 and the stacked chips 8 are formed as described below, for example. First, the memory chip 6B is stacked on the memory chip 6A. For example, the bump electrode 16B and the adhesive spacers 18 are formed on the second (non-circuit) surface of the memory chip 6B. The memory chip 6B is thermocompression-bonded to the memory chip 6A while the bump electrode 16B is aligned with the bump electrode 14A of the memory chip 6A. The adhesive spacers 18 are placed between the memory chip 6A and the memory chip 6B. Accordingly, when the memory chip 6B is thermocompression-bonded to the memory chip 6A, the gap between the memory chips 6A and 6B remains. Similarly, the memory chip 6C is stacked on the memory chip 6B. Similarly, the IF chip 7 with the bump electrode 25 formed on the circuit surface is stacked on the memory chip 6C.

The temperature of compression bonding may be equal to or more than the temperature of connection between the bump electrode 14 and the bump electrode 16 or 25 or may be the temperature for temporary connection between the bump electrode 14 and the bump electrode 16 or 25. If temporary connection is made between the bump electrode 14 and the bump electrode 16 or 25, all semiconductor chips including the memory chip 6 and the IF chip 7 are stacked and, in a reducing atmosphere, compression bonding or reflow is performed at a temperature equal to or more than the temperature of connection between the bump electrode 14 and the bump electrode 16 or 25. The adhesive spacers 18 are cured in a process such as the thermocompression bonding process for the memory chip 6. In this way, a connection between the bump electrode 14 and the bump electrodes 16 and 25 is made and the adhesive spacers 18 are bonded to the memory chip 6. The adhesive spacers 18 may also be placed between the memory chip 6C and the IF chip 7. After that, the under-fill resin 26a is filled into the gaps between the memory chips 6A to 6C and the under-fill resin 26b is filled into the gap between the memory chip 6C and the IF chip 7 and then cure processing is performed. The under-fill resins 26a and 26b may be filled concurrently or separately.

As described above, if the adhesive spacers 18 are placed between the memory chips 6A, 6B, and 6C and, as necessary, between the memory chip 6C and the IF chip 7, it is possible to improve the adhesive strengths between the memory chips 6A, 6B, and 6C in the stacked body 61 and the adhesive strength between the stacked body 61 and the IF chip 7 before the under-fill resin 26 is filled. However, if the number of stacked memory chips 6 increases, warpage of the memory chip 6 after compression bonding may not be suppressed sufficiently. That is, if the pressure applied to perform thermocompression bonding of the memory chips 6 is released, warpage of the memory chips 6 may extend the adhesive spacers 18, causing the bump connection 17 (comprising the bump electrode 14 and the bump electrode 16) to break.

Warpage of the memory chip 6 occurs due to various factors. However, warpage is considered to occur particularly because of a thermal expansion difference between the silicon in the semiconductor substrate 11 of the memory chip 6 and an organic insulating resin such as a polyimide resin included in the organic protective film 19. Specifically, a thermal expansion coefficient of Si is 3 ppm/° C. and a thermal expansion coefficient of a polyimide resin is 10 ppm/° C. or more (for example, 10 to 50 ppm/° C. or the like). Accordingly, in the thermocompression bonding process of the memory chip 6, expansion of the organic protective film 19 is larger than that of the semiconductor substrate 11. During contraction in the cooling process after thermocompression bonding, concave warpage is likely to occur on the first surface (circuit surface) of the memory chip 6 of the chip stack 8.

Accordingly, in the chip stack 8 according to the embodiment, the first surface (circuit surface) of the memory chip 6C on which the re-wiring layer 20 is present is covered with the organic protective film 19, while the first surfaces (circuit surfaces) of the other memory chips 6A and 6B and the IF chip 7 are covered with the inorganic protective films 13 and 24. That is, the memory chips 6A and 6B and the IF chip 7 include no organic protective film. Therefore, on the first surface (circuit surface) sides of the memory chips 6A and 6B, the inorganic protective films 13A and 13B are in contact with the first under-fill resin 26a. On the first surface (circuit surface) side of the memory chip 6C, the organic protective film 19 is in contact with the second under-fill resin 26b. On the first surface (circuit surface) side of the IF chip 7, the inorganic protective film 24 is in contact with the second under-fill resin 26b.

In the chip stack 8 according to the embodiment, the memory chip 6C includes the organic protective film 19 required to form the re-wiring layer 20. The other memory chips 6A and 6B and the IF chip 7 do not include the organic protective film 19. In the inorganic insulating material included in the inorganic protective films 13 and 24, for example, the silicon nitride film has a thermal expansion coefficient of 2.5 to 3 ppm/° C. or the like, which approximates the thermal expansion coefficient of Si. Accordingly, unlike the organic protective film, a thermal expansion difference with Si does not cause significant warpage of the memory chip 6. That is, even if the memory chip 6 or the IF chip 7 includes the inorganic protective films 13 and 24, a thermal expansion difference in the thermocompression bonding process and the like will not cause significant warpage.

In a comparative example, in a chip stack including memory chips and IF chips, all semiconductor chips have an organic protective film. If the number of stacked semiconductor chips increases, effects of a thermal expansion difference between the semiconductor substrate and the organic protective film become large, thereby increasing the amount of warpage of the semiconductor chips in the thermocompression bonding process and the like. Even if adhesive spacers are placed between the semiconductor chips, an increase in the amount of warpage of the semiconductor chips expands the adhesive spacers, risking a breakage in the bump connection.

In a chip stack in another comparative example, all semiconductor chips lack an organic protective film. However, organic insulating materials tend to have a lower relative permittivity than inorganic insulating materials. For example, the inorganic insulating material silicon nitride film has a relative permittivity of about 6.0. On the other hand, the organic insulating material polyimide resin has a relative permittivity of about 3.5. Therefore, organic insulating materials tend to more effectively suppress a signal delay through the re-wiring layer 20. Without the organic protective film, the signal delay through the re-wiring layer 20 becomes longer.

On the other hand, in the chip stack 8 according to the embodiment, only the memory chip 6C with the re-wiring layer 20 includes the organic protective film 19. Accordingly, even if the number of stacked memory chips 6 increases, the effects of a thermal expansion difference between the semiconductor substrate and the organic protective film do not increase proportionally, limiting warpage of the memory chip 6. Therefore, expansion of the adhesive spacers 18 caused by warpage of the memory chip 6 is suppressed, effectively preventing the occurrence of a connection failure (open failure) in the bump connection 17. Even in an embodiment in which the chip stack 8 includes no adhesive spacers 18, the presence of an organic protective film on the semiconductor substrate reduces warpage of a semiconductor chip caused by a thermal expansion difference between the semiconductor substrate and the organic protective film. Accordingly, occurrence of a connection failure (open failure) in the bump connection may be suppressed.

The chip stack 8 described above is mounted on the second surface 2b of the circuit board 2, as shown in FIG. 1. A part of the electrode 23 of the IF chip 7 is connected to the re-wiring layer 20 through the bump electrode 27, and the re-wiring layer 20 is electrically connected to the internal connection terminals 5 of the circuit board 2 through the bump electrode 28. The re-wiring layer 20 electrically connects a part of the electrode 23 of the IF chip 7 to the internal connection terminals 5 of the circuit board 2 and also electrically connects the electrode 23 of the IF chip 7 to the electrode 12C of the memory chip 6C. Therefore, the stacked body 61 is electrically connected to the circuit board 2 through the IF chip 7.

Because the distance between the circuit board 2 and the memory chip 6C is greater than the distance between the circuit board 2 and the IF chip 7, the bump electrode 28, which connects the re-wiring layer 20 to the internal connection terminals 5 disposed on the circuit board 2, is larger in size than the bump electrode 27, which connects the re-wiring layer 20 to the IF chip 7. The gap between the chip stack 8 and the circuit board 2 is filled with an under-fill resin 29. A sealing resin layer 30 including an insulating resin such as an epoxy resin is, for example, molded on the circuit board 2 so as to seal the chip stack 8. The under-fill resin 29 may be omitted. In this case, the sealing resin 30 is filled into the gap between the chip stack 8 and the circuit board 2. The organic protective films 19a and 19b protect the memory chip 6C from filler in the sealing resin 30. In this way, the semiconductor device 1 according to the embodiment is configured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
a first semiconductor chip including a first semiconductor substrate comprising silicon and having a first surface and a second surface, a first electrode on the first surface of the first semiconductor substrate, and a first inorganic protective film covering at least a part of the first surface of the first semiconductor substrate while exposing at least a part of the first electrode;
a first bump electrode on the first electrode;
a second semiconductor chip including a second semiconductor substrate comprising silicon and having a first surface and a second surface, a via through the second semiconductor substrate from the first surface to the second surface, the via being electrically connected to the first bump electrode, a second electrode on the first surface of the second semiconductor substrate and electrically connected to the via, and a second inorganic protective film covering at least a part of the first surface of the second semiconductor substrate while exposing at least a part of the second electrode, the first surface of the first semiconductor substrate facing the first surface of the second semiconductor substrate;
a first organic protective film between the first semiconductor chip and the second semiconductor chip and directly contacting at least a part of the second inorganic protective film while exposing at least a part of the second electrode;
a re-wiring layer directly contacting the first organic protective film, the re-wiring layer being electrically connected to the first electrode and the second electrode, the first organic protective film being between a portion of the re-wiring layer and a portion of the second inorganic protective film;

a second bump electrode on the second surface of the second semiconductor chip and electrically connected to the re-wiring layer through the via;

a third semiconductor chip including a third semiconductor substrate comprising silicon, a third electrode on a first surface of the third semiconductor substrate and electrically connected to the second bump electrode, a third inorganic protective film covering the first surface of the third semiconductor substrate while exposing at least a part of the third electrode, the first surface of the third semiconductor substrate facing the second surface of the second semiconductor substrate;

a first resin layer between the first semiconductor chip and the second semiconductor chip, the first resin layer being in direct contact with the first inorganic protective film; and a second resin layer between the second semiconductor chip and the third semiconductor chip, the second resin layer being in direct contact with the third inorganic protective film and not in direct contact with the second inorganic protective film.

2. The semiconductor device according to claim 1, wherein the second resin layer is directly contacting the first organic protective film.

3. The semiconductor device according to claim 1, further comprising:
a second organic protective film directly contacting at least a part of the re-wiring layer and at least a part of the first organic protective film, the re-wiring layer being between the first organic protective film and the second organic protective film.

4. The semiconductor device according to claim 3, wherein the second resin layer is in contact with the second organic protective film.

5. The semiconductor device according to claim 1, further comprising:
a first spacer between the first semiconductor chip and the second semiconductor chip.

6. The semiconductor device according to claim 1, further comprising:
a second spacer between the second semiconductor chip and the third semiconductor chip.

7. The semiconductor device according to claim 1, further comprising:
a wiring board having a first surface and a second surface, an external connection terminal provided on the first surface of the wiring board, an internal connection terminal provided on the second surface of the wiring board;
a fourth bump electrode being electrically connected to the third electrode;
a fifth bump electrode provided below at least a part of the second electrode, the internal connection terminal being electrically connected to the fifth bump electrode; and
a molding resin layer sealing at least a part of the second surface of the wiring board, the first semiconductor chip, the second semiconductor chip, and the third semiconductor chip.

8. The semiconductor device according to claim 7, wherein a thickness of the molding resin layer is at least a distance from the second surface of the wiring board to the second surface of the third semiconductor substrate.

9. The semiconductor device according to claim 7, further comprising:
a third resin layer provided between the wiring board and the third semiconductor chip, the third resin layer being in contact with the second surface of the third substrate.

10. The semiconductor device according to claim 7, wherein the second semiconductor chip is between the first semiconductor chip and the wiring board.

11. The semiconductor device according to claim 10, wherein the third semiconductor chip is between the first semiconductor chip and the wiring board.

12. The semiconductor device according to claim 7, wherein the first organic protective film is between the first surface of the first semiconductor substrate and the first surface of the second semiconductor substrate, and the first organic protective film separates a portion of the second inorganic protective film and a portion of the re-wiring layer.

13. The semiconductor device according to claim 1, wherein the first organic protective film is between the first surface of the first semiconductor substrate and the first surface of the second semiconductor substrate, and the first organic protective film separates a portion of the second inorganic protective film and a portion of the re-wiring layer.

14. The semiconductor device according to claim 13, wherein the second semiconductor chip is between the first semiconductor chip and the third semiconductor chip.

15. The semiconductor device according to claim 1, wherein the first organic protective film is one of a polyimide resin film, a phenol resin film, acrylic resin film, a polybenzoxazole resin film, or a polybenzocyclobutene resin film.

16. The semiconductor device according to claim 1, wherein the second inorganic protective film has the first organic protective film disposed directly thereon, and the first organic protective film is not directly contacting either of the first inorganic protective film and the third inorganic protective film.

17. The semiconductor device according to claim 1, wherein a difference between a thermal expansion coefficient of the first inorganic protective film and a thermal expansion coefficient of silicon is smaller than a difference between a thermal expansion coefficient of the first organic protective film and the thermal expansion coefficient of silicon.

* * * * *